(12) United States Patent
Lee et al.

(10) Patent No.: US 10,566,477 B2
(45) Date of Patent: Feb. 18, 2020

(54) MANUFACTURING METHOD FOR FLEXIBLE DEVICE, FLEXIBLE DEVICE, SOLAR CELL, AND LIGHT EMITTING DEVICE

(75) Inventors: Keon Jae Lee, Daejeon (KR); Sang Yong Lee, Gwangju (KR)

(73) Assignees: SK Siltron Co., Ltd. (KR); Korea Advanced Institute of Science Technology (KR)

( * ) Notice: Subject to any disclaimer, the term of this patent is extended or adjusted under 35 U.S.C. 154(b) by 1226 days.

(21) Appl. No.: 13/010,108

(22) Filed: Jan. 20, 2011

(65) Prior Publication Data

US 2011/0174377 A1 Jul. 21, 2011

(30) Foreign Application Priority Data

Jan. 20, 2010 (KR) .......................... 10-2010-0005035

(51) Int. Cl.
*H01L 33/00* (2010.01)
*H01L 27/15* (2006.01)
(Continued)

(52) U.S. Cl.
CPC .... *H01L 31/0392* (2013.01); *H01L 31/03046* (2013.01); *H01L 31/03926* (2013.01);
(Continued)

(58) Field of Classification Search
CPC ................ H01L 31/18; H01L 31/1852; H01L 31/03044; H01L 31/1856; H01L 31/1892;
(Continued)

(56) References Cited

U.S. PATENT DOCUMENTS 6,071,795 A    6/2000   Cheung et al.
6,284,721 B1 * 9/2001   Lee ................................ 438/689
(Continued)

FOREIGN PATENT DOCUMENTS

JP     2008538658 A     10/2008
KR    20060063899 A     6/2006
(Continued)

OTHER PUBLICATIONS

Lee et al, A Printable Form of Single-Crystalline Gallium Nitride for Flexible Optoelectronic Systems, 2005, Small, 1, 12, (Year: 2005) 1164-1168.*

(Continued)

*Primary Examiner* — Andrew J Golden
(74) *Attorney, Agent, or Firm* — Lewis Roca Rothgerber Christie LLP

(57) ABSTRACT

Provided are a method of manufacturing a flexible device and the flexible device, a solar cell, and a light emitting device. The method of manufacturing a flexible device includes providing a device layer on a sacrificial substrate, contacting a flexible substrate on one side surface of the device layer, and removing the sacrificial substrate. A large area device may be transferred onto the flexible substrate with superior alignment to realize and manufacture the flexible device. In addition, since mass production is possible, the economic feasibility may be superior. Also, when a large area solar cell having a thin thickness is manufactured, since a limitation such as twisting of a thin film of a solar cell may be effectively solved, the economic feasibility and stability may be superior.

2 Claims, 14 Drawing Sheets

(51) Int. Cl.
    *H01L 33/32*     (2010.01)
    *H01L 31/0392*     (2006.01)
    *H01L 31/0304*     (2006.01)
    *H01L 31/18*     (2006.01)

(52) U.S. Cl.
CPC ...... H01L 31/1896 (2013.01); H01L 33/0079 (2013.01); *H01L 27/156* (2013.01); *H01L 33/32* (2013.01); *Y02E 10/544* (2013.01); *Y02P 70/521* (2015.11)

(58) Field of Classification Search
CPC .......... H01L 31/1896; H01L 21/02458; H01L 21/0254; H01L 21/6835; H01L 27/156; H01L 33/0075; H01L 33/0079; H01L 33/32; H01L 31/0392; B81C 2201/0185; B81C 1/00373
USPC .................. 136/243–265; 438/28, 34, 36
See application file for complete search history.

(56) References Cited

U.S. PATENT DOCUMENTS

| | | | |
|---|---|---|---|
| 6,696,325 | B1 | 2/2004 | Tsai et al. |
| 7,923,629 | B2 | 4/2011 | Park et al. |
| 8,101,498 | B2 | 1/2012 | Pinnington et al. |
| 8,101,851 | B2 | 1/2012 | Dubbeldam |
| 2001/0012677 | A1 | 8/2001 | Sameshima |
| 2002/0014629 | A1* | 2/2002 | Shibata et al. .................. 438/22 |
| 2003/0134447 | A1* | 7/2003 | Shibata et al. .................. 438/46 |
| 2006/0038182 | A1* | 2/2006 | Rogers et al. .................. 257/77 |
| 2006/0144435 | A1* | 7/2006 | Wanlass ............ H01L 31/06875 136/249 |
| 2006/0214173 | A1* | 9/2006 | Beeson .................. H01L 33/20 257/80 |
| 2007/0128774 | A1 | 6/2007 | Yamada |
| 2009/0133914 | A1* | 5/2009 | Dellmann ............... H01L 24/95 174/260 |
| 2010/0317132 | A1* | 12/2010 | Rogers ................ H01L 25/0753 438/27 |

FOREIGN PATENT DOCUMENTS

| | | |
|---|---|---|
| KR | 20070059794 A | 6/2007 |
| WO | WO 2006/033822 A2 | 3/2006 |
| WO | WO 2008/147105 A2 | 12/2008 |

OTHER PUBLICATIONS

Iwase, Eiji et al., "Temperature-Controlled Transfer and Self-Wiring for Multi-Color LED Display on a Flexible Substrate", Micro Electro Mechanical Systems, 2009, IEEE 22nd International Conference ON, Jan. 25, 2009, pp. 176-179, XP031444258, ISBN: 978-1-4244-2977-6.

Matsushita, T. et al., "Integrated-Type 10 [mu]M-Thick Single-Crystal Silicon Solar Cells Transferred to Plastic Film", 16th European Photovoltaic Solar Energy Conference, Glasgow, UK, May 1-5, 2000, pp. 1679-1682, XP001138977, ISBN: 978-1-902916-18-7.

European Search Report completed Aug. 15, 2016, issued in corresponding EP Application No. 11151142, 4 pages.

Korean Notice of Allowance issued by the KIPO dated Mar. 16, 2012 for corresponding Application No. KR 10-2010-0005035 (2 pages).

* cited by examiner

MANUFACTURING METHOD FOR FLEXIBLE DEVICE, FLEXIBLE DEVICE, SOLAR CELL, AND LIGHT EMITTING DEVICE

CROSS REFERENCE TO RELATED APPLICATIONS

The present application claims the priority benefit of Korean patent application number 10-2010-0005035 filed Jan. 20, 2010, the disclosure of which is incorporated by reference.

BACKGROUND OF THE INVENTION

Field of the Invention

The present disclosure relates to a method of manufacturing a flexible device, the flexible device, a solar cell, and a light emitting device, and more particularly, to a flexible device manufacturing method through which various large area devices having flexible properties are precisely aligned with each other and a flexible device having greater economic feasibility is manufactured, the flexible device, a solar cell, and a light emitting device.

Description of the Related Art

As ubiquitous as the information age has become, the demand of a flexible device conveniently usable in various living conditions is being increased. Thus, research for realizing a flexible device is being conducted in many different fields. Among these is research using nano materials such as a nano wire (NW) and a carbon nano tube (CNT) or using organic semiconductors is in the spotlight. In 2001, the world's first flexible display using an organic semiconductor was realized by Bell Labs. Since the materials have low electrical performance (effective mobility of the organic semiconductor and the nano wire are about ~1 Cm^2/Vs and about ~5 Cm^2/Vs, respectively) and it is difficult to secure uniformity of the material and perform processes, it has been very difficult so far to commercialize the flexible display using the organic semiconductor. To solve these limitations, a printable microstructure semiconductor (μs-Sc) was introduced at the Illinois Institute of Technology in 2004 (Appl. Phys. Lett. 84, 5398, 2004).

This technology in which single crystal silicon having superior device performance directly takes off from a bulk silicon substrate to obtain a microstructure semiconductor. The obtained microstructure semiconductor is then transferred onto a flexible substrate using a soft lithography process. The device manufactured by transferring the single crystal microstructure semiconductor onto the flexible substrate has the most excellent electrical performance (effective mobility>about 500 Cm^2/Vs) among existing flexible electronic materials (IEEE Electron Device Lett. 27, 460, 2006).

According to this technology, the microstructure semiconductor is designed in a dumbbell shape, and a lower portion of the microstructure semiconductor is etched to manufacture a support shaft. The microstructure semiconductor then takes off using a polydimethylsiloxane (PDMS) stamp to selectively transfer only the microstructure semiconductor disposed on a desired position.

According to this technology, a device may be manufactured on a desired position of a plastic substrate using the selective transfer, as well as the microstructure semiconductor remaining on an SOI substrate after transferring may be transferred onto a position required later to use the microstructure semiconductor. As a result, the manufacturing costs may be reduced.

When the microstructure semiconductor is selectively transferred, because the PDMS stamp having an uneven shape is used, a sagging effect in which a recessed portion is collapsed due to proper properties of the PDMS may occur to separate the undesired microstructure semiconductor. In addition, when the microstructure semiconductor is transferred, contraction and relaxation of the PDMS may occur. As a result, it is difficult to precisely align the microstructure semiconductor with the PDMS stamp on the silicon substrate.

Furthermore, it is difficult to etch a device having a relatively large area due to a limitation of an infiltration rate of an etchant and the sagging effect. When the silicon substrate is etched downward from a top surface, a limitation of a unit device may be about 100 μm. Thus, in the method of manufacturing the flexible device according to the related-art, there is a limitation to the manufacture of large area flexible devices such as solar cells and light emitting devices. There is an urgent need for technologies which can overcome the above-described limitations.

The solar cells may be expected as an item capable of applying the flexible device. The solar cells convert solar energy into electricity energy. Also, the solar cells are called an electronic device, which generates electricity using two kinds of semiconductors referred to as a P-type semiconductor and an N-type semiconductor. Typically, a silicon substrate solar cell having about 25% of efficiency makes up the main part of the solar cells. However, solar cells formed of various materials, which can realize high efficiency are being developed in recent years.

InGaN among such materials has an emission wavelength covering the range from an approximately UV wavelength region to a green spectrum region and is widely used as an active material of a related-art light emitting device or laser diode. Recently, since InGaN has a band gap adjustable in the entire alloy region and has high carrier mobility, drift velocity, radiation resistance, and characteristic having a light absorption index of about 105 cm-1 that is about a band boundary, InGaN is being in the spotlight as a new material for solar cells.

However, an InGaN-based solar cell reported so far is rigid like silicon or sapphire and has a structure in which a rigid substrate includes an InGaN layer. Thus, an InGaN-based solar cell formed on a flexible substrate is not yet disclosed. Particularly, an intense process of manufacturing solar cells based on a high-temperature semiconductor process limits a range of substrate selection.

SUMMARY OF THE CLAIMED INVENTION

Embodiments provide a method of manufacturing a flexible device on a flexible substrate, which has various advantages such as superior alignment and economical manufacture in a large area, the flexible device, a solar cell, and a light emitting device.

In one embodiment, a method of manufacturing a flexible device includes: providing a device layer on a sacrificial substrate; contacting a flexible substrate on one side surface of the device layer; and removing the sacrificial substrate.

In another embodiment, a flexible device includes: a flexible substrate; an adhesion layer disposed on the flexible substrate; and a device layer adhering to the adhesion layer.

In further another embodiment, a solar cell includes: a flexible substrate; an adhesion layer disposed on the flexible substrate; a p-GaN layer adhering to the adhesion layer; an InGaN layer stacked on the p-GaN layer; and an n-GaN layer stacked on the InGaN layer.

In a still further another embodiment, a light emitting device includes: a flexible substrate; an adhesion layer disposed on the flexible substrate; a p-GaN layer adhering to the adhesion layer; an InGaN layer stacked on the p-GaN layer; and an n-GaN layer stacked on the InGaN layer.

DETAILED DESCRIPTION

Figure 1:
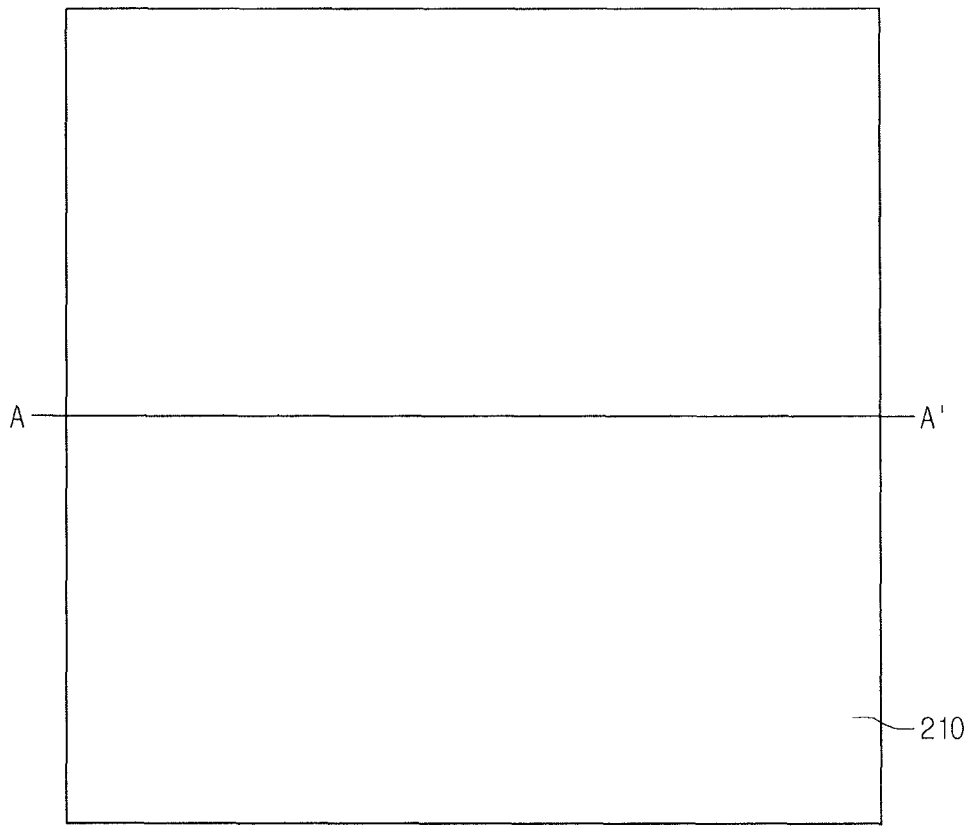
FIGS. 1 to 5 sequentially illustrate each process of manufacturing a solar cell.
Figure 1:
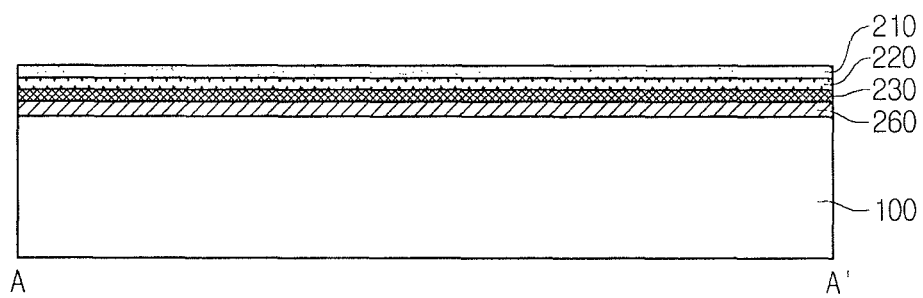

The details of one or more embodiments are set forth in the accompanying drawings and the description below. Other features will be apparent from the description and drawings, and from the claims. Reference will now be made in detail to the embodiments of the present disclosure, examples of which are illustrated in the accompanying drawings. These embodiments are provided so that this disclosure will be thorough and complete, and will fully convey the scope of the present disclosure to those skilled in the art. Thus, the present disclosure may be embodied in different forms and should not be construed as limited to the embodiments set forth herein.

In the figures, the widths, lengths, and thicknesses of components may be exaggerated for clarity of illustration. Like reference numerals refer to like elements throughout. The whole drawings attached to this application are illustrated as plan views and partially sectional views taken along line A-A'.

In the current embodiment, a device layer of an electronic device such as a solar cell, which can be manufactured at a high temperature and has superior alignment even though various processes are performed, is stacked on a sacrificial substrate exemplified as a silicon substrate. After the device layer is manufactured, a flexible substrate adheres to a top surface of the device layer, and then, the sacrificial substrate is removed to manufacture a flexible solar cell.

A GaN-based solar cell and a light emitting device are described as an example in the current embodiment. However, the whole devices which is grown on the sacrificial substrate exemplified as the silicon substrate on which the device layer can be grown, such as a ferroelectric BTO capacitor, a thin film lithium secondary battery, and a GaAs light emitting device, may be included in a range of the present disclosure. Also, the device layer may be grown on the sacrificial substrate using various processes such as a sputtering process, a chemical vapor deposition (CVD) process, a sol-gel process, and a spin-coating process, but it is not limited to the exemplified range of the present disclosure.

A limitation in which a thin film structure of the solar cell is not maintained in a flat state, but is fold or twisted when the device layer on the sacrificial substrate, e.g., the device layer formed of a thin film constituting the solar cell is separated from the substrate. To solve such the limitation, the present disclosure provides a flexible device manufacturing method in which the other flexible substrate layer for preventing the device layer from being fold is stacked on the other side (i.e., a top surface of the device layer) of the device layer to continuously maintain the flat structure after the flat structure of the device layer manufactured on the sacrificial substrate such as the silicon substrate is separated from the sacrificial substrate. The above-described method has an advantage in a method of manufacturing a large area flexible device. This is done because the thin film of the device is easily deformed or twisted as the device is increased in area.

Hereinafter, a solar cell that is a device according to an embodiment will be described with reference to the accompanying drawings. However, the present disclosure is not limited to the solar cell. For example, the whole devices capable of being manufactured on the sacrificial substrate may be included in the range of the present disclosure.

FIGS. 1 to 5 sequentially illustrate each process of manufacturing a solar cell. Referring to FIG. 1, an AlN buffer layer 260, a GaN layer (n-GaN layer) 230 doped with an n-type dopant, an undoped InGaN layer (i-InGaN layer) 220, and a GaN layer (p-GaN layer) 210 doped with a p-type dopant are sequentially stacked on a silicon substrate 100 that is a sacrificial substrate. The above-described structure may be a GaN-based solar cell structure. Also, the above-described structure may be a structure in which p-type and n-type GaN layers through which holes or electrons flow are vertically stacked. Here, since the stacking process (e.g., CVD, etc.) of the solar cell device layer is performed on a rigid substrate such as a silicon substrate, a process application limitation does not exist. Also, it is natural that the solar cell may have various stacked structures as an example of a fundamental structure. In addition, although a single solar cell is illustrated in the drawings, the present disclosure is not limited thereto. For example, a plurality of solar cells may be spaced from each other, and the solar cells spaced from each other may be connected to each other.

Figure 2:
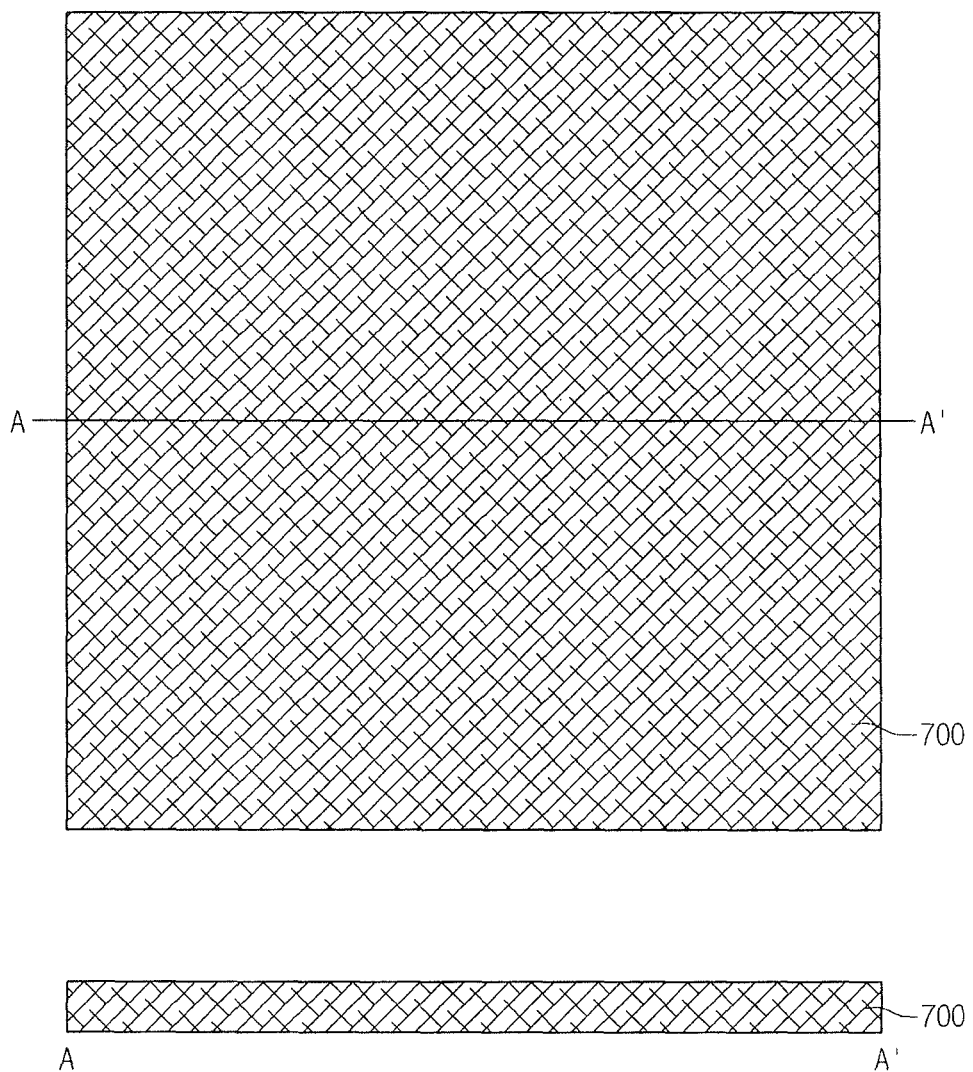

Referring to FIG. 2, a flexible substrate 700 contacting or adhering to a top surface of the solar cell of FIG. 1 is disclosed. The solar cell manufactured on the silicon substrate is transferred onto the flexible substrate 700. For example, a plastic substrate based on a material such as polyester (PET) may be used as the flexible substrate.

Figure 3:
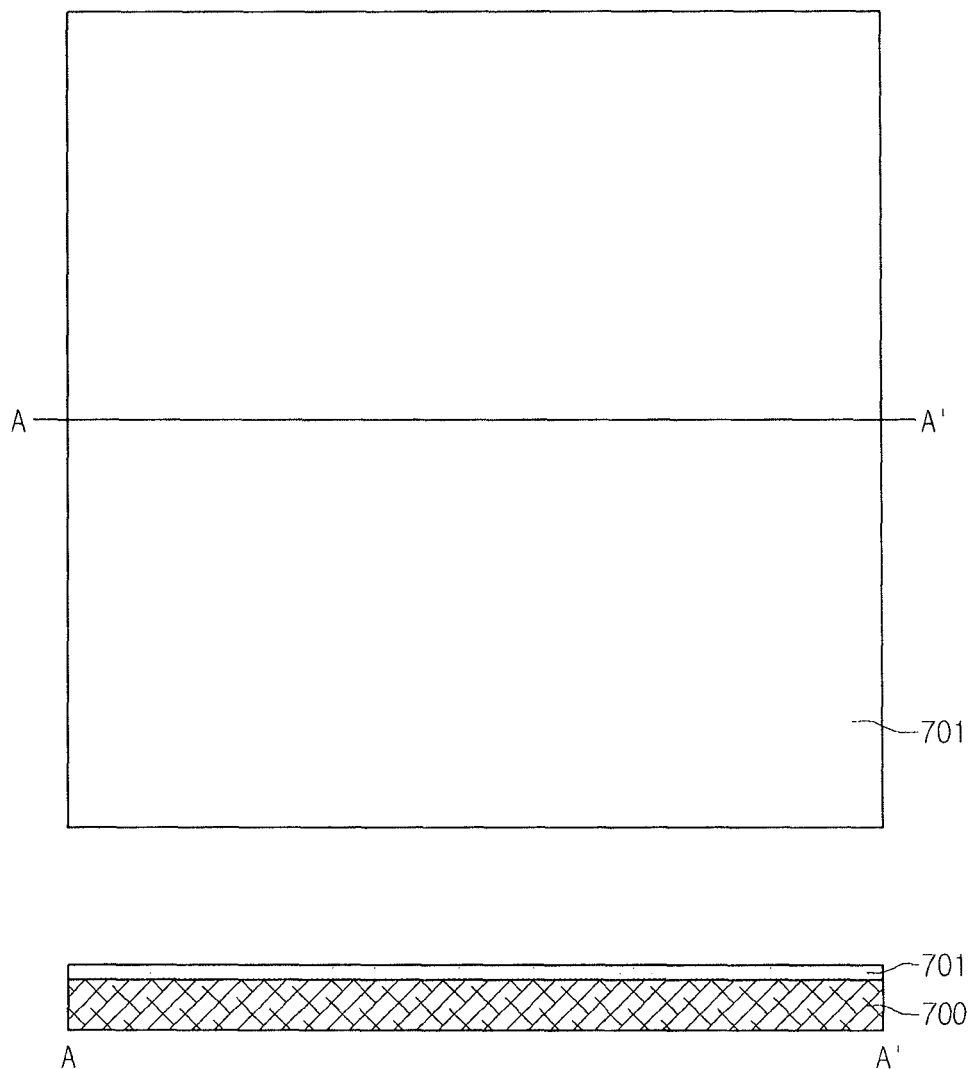

Referring to FIG. 3, an adhesion layer 701 is staked on the flexible substrate 700. The adhesion layer 701 may perform a function for attaching the solar cell of FIG. 1 to the flexible substrate 700. In addition, when the solar cell is separated from the silicon substrate, the adhesion layer may prevent the separated solar cell from being bent or twisted (specifically, such the phenomenon may significantly occur when the solar cell has a thin thickness or a large area). For example, the adhesion layer 701 may be formed of an adhesion material such as epoxy or polyurethane. Alternatively, the adhesion layer 701 may be formed of any materials that can attach the flexible substrate to the solar cell, and this is included in the range of the present disclosure.

Figure 4:
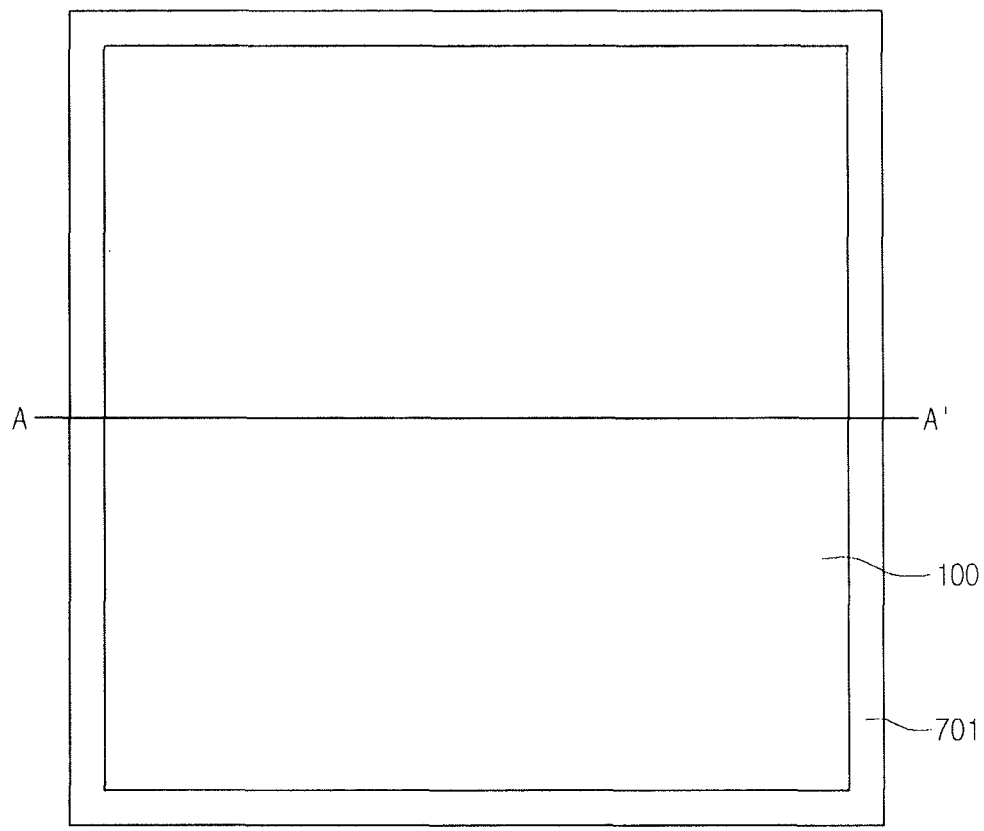
Figure 4:
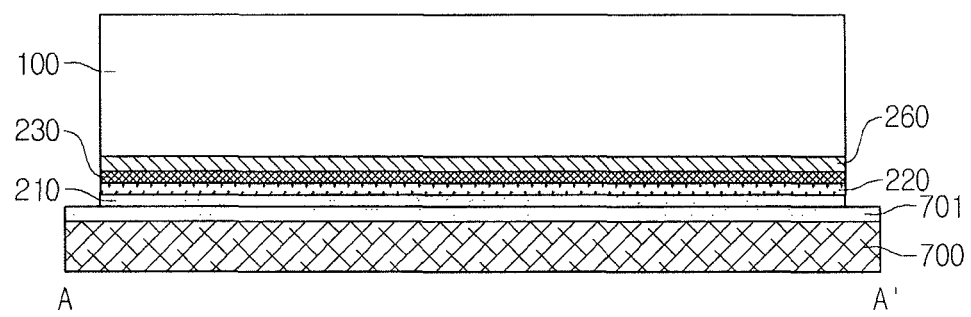

Referring to FIG. 4, the solar cell device layer illustrated in FIG. 1 adheres to the adhesion layer 701 formed on the flexible substrate 700. That is, the p-GaN layer 210 that is the uppermost layer of the solar cell device stacked on the silicon substrate 100 facingly contacts the adhesion layer 701 stacked on the flexible substrate. Thus, the flexible substrate 700 and the silicon substrate 100 on which the solar cell device layer is formed on the top surface thereof may physically adhere to each other. That is, the above-described structure has a kind of a sandwich shape in which the solar cell device layer manufactured on the silicon substrate is inserted between the silicon substrate 100 and the flexible substrate 700.

Figure 5:
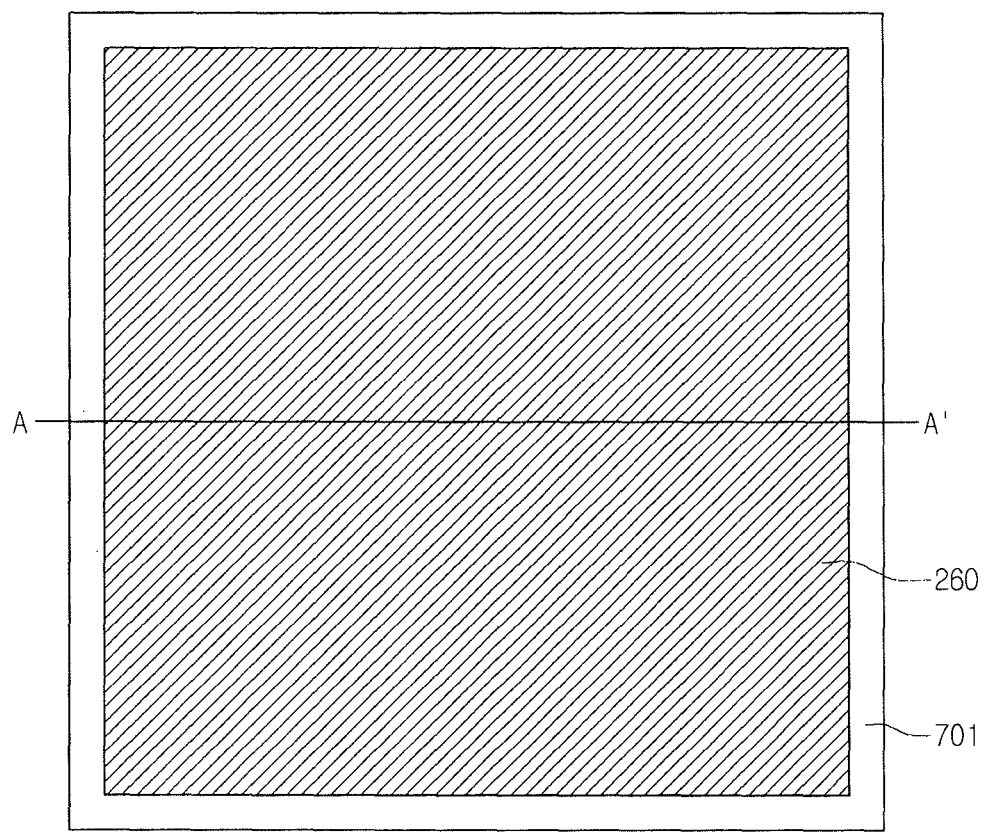
Figure 5:
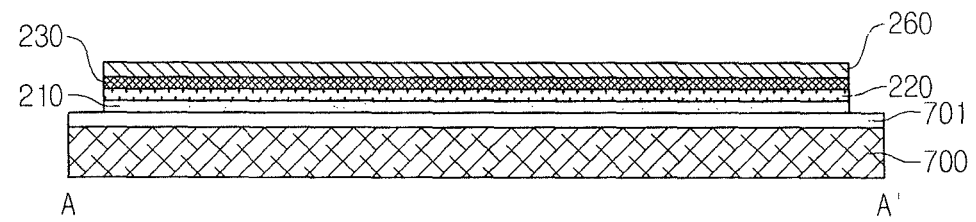

Referring to FIG. 5, the silicon substrate 100 is removed to manufacture the solar cell (p-GaN: i-InGaN: n-GaN structure) formed on the flexible substrate 700. The silicon substrate 100 may be removed through various methods. For example, the GaN solar cell and the silicon substrate may be separated from each other using a method in which a wet etching process or an excimer laser process is performed using a specific etchant (fluorine) to fuse a boundary between GaN and the silicon substrate. When the thin film of the solar cell manufactured on the sacrificial substrate is simply separated, the solar cell may become a free-standing state in which a support substrate is not provided. As a result, the thin film of the solar cell is not maintained in its first manufactured state, and thus may be twisted or fold.

Thus, the flexible substrate 700 adheres first to the solar cell before the lower sacrificial substrate is removed to separate the solar cell from the sacrificial substrate. That is, the flexible substrate 700 may serve as a support substrate for supporting the thin film of the separated solar cell as wall as prevent the solar cell from being bent or twisted when the thin film of the solar cell is separated from the sacrificial substrate. Specifically, when a solar cell having a large area and a thin thickness is manufactured on the flexible substrate, the above-described method may be very advantageous.

When the silicon substrate is removed, the flexible substrate and the solar cell device layer should not be damaged. For this, the inventor found following methods as an etching method. Particularly, a component A (Ammonium hydrogen fluoride+Ammonium nitrate) and a component 13 (dilute sulfuric acid) as an etchant are mixed at a ratio of about 1:1 to about 1:2, and the adhesion layer is formed of polyurethane. As shown in FIG. 4, the wet etching process using the etchant is preformed on a product in which the sacrificial substrate adheres to the flexible substrate, and the results are illustrated.

Figure 6:
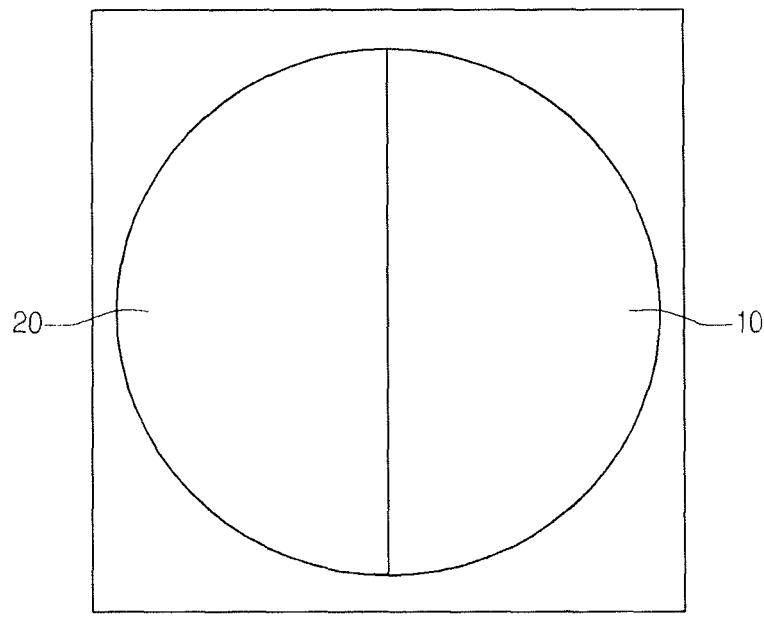
FIG. 6 is a view of a GaN layer transferred onto a PET substrate manufactured according to an embodiment of the prevent invention.
Figure 6:
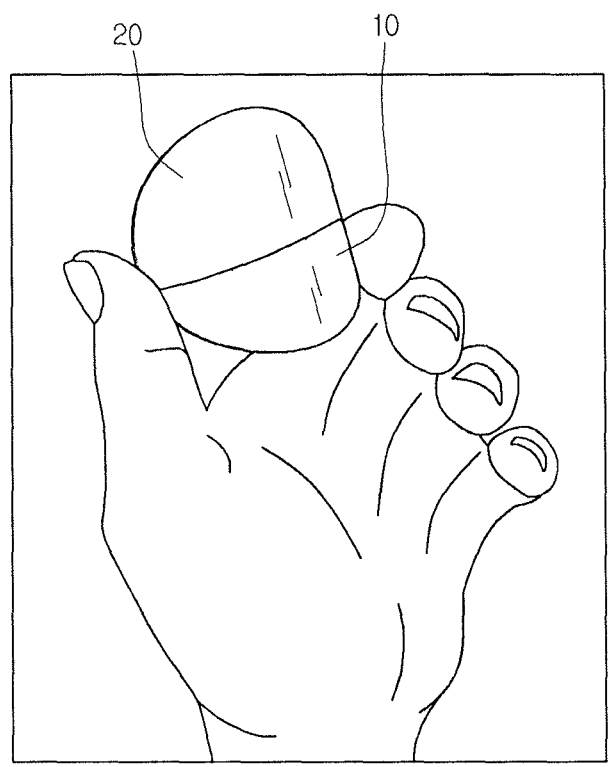

Firstly, when the flexible substrate is a PET-based plastic substrate, as shown in FIG. 6, the flexible substrate and the solar cell device layer are not damaged. However, under the same etching condition, when the flexible substrate is a PC-based plastic substrate, the flexible substrate is bent and the device layer cracks. Also, under the same etching condition, when the flexible substrate is a kapton film, the flexible substrate and the sacrificial substrate are separated from each other. According to the above-described results, the PET-based plastic substrate may be used when the flexible device is manufactured. Also, since PET is inexpensive, the PET-based plastic substrate is superior in economical aspects. In addition, PET has excellent transparency.

FIG. 6 is a view of a GaN layer transferred onto a PET substrate manufactured according to an embodiment. Referring to FIG. 6, in the solar cell according to the current embodiment, it is seen that a PET substrate 20 and a GaN-based thin film 10 have sufficient transparency and flatness and stably adhere to each other even though the silicon substrate is removed.

Figure 7:
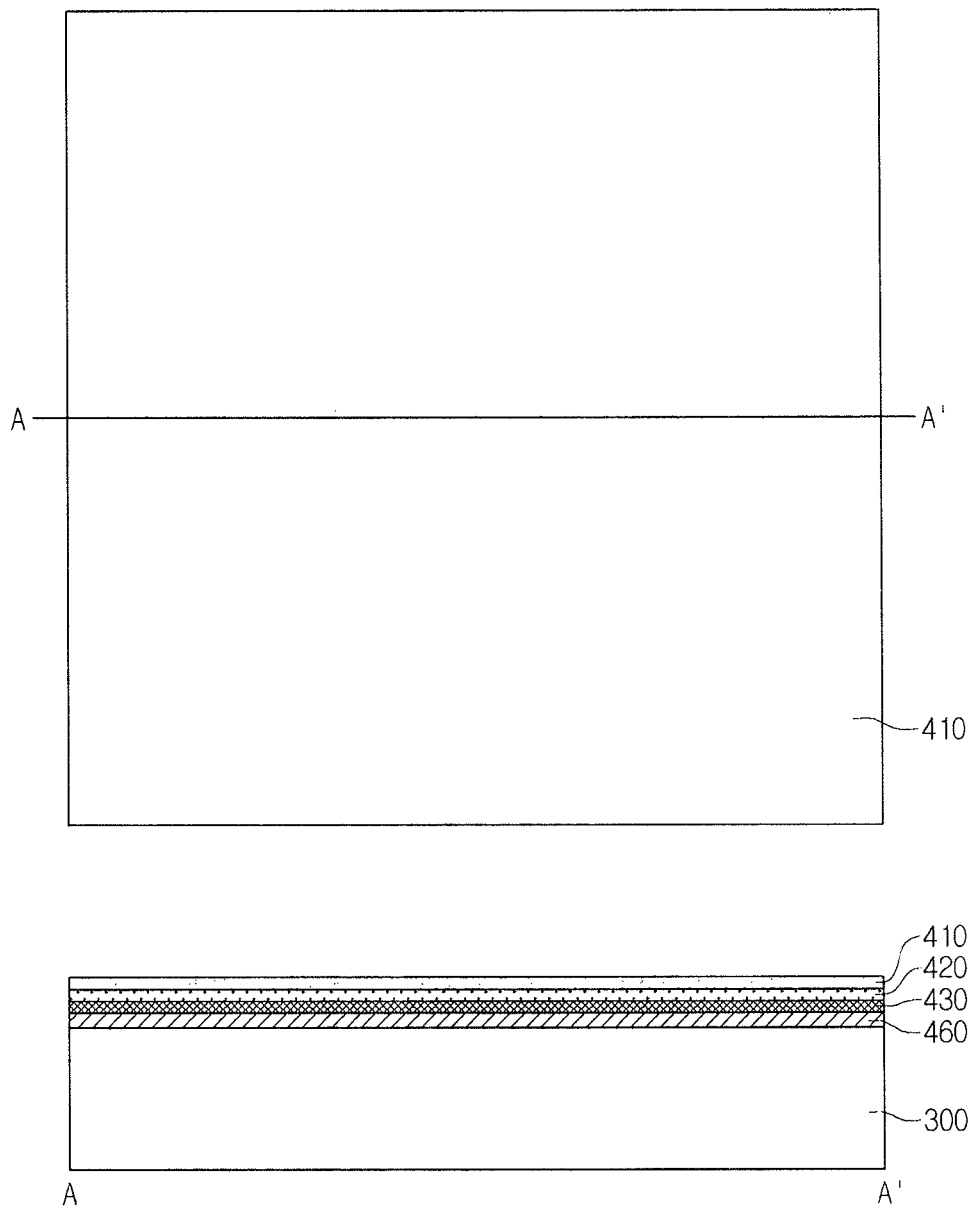
FIGS. 7 to 13 illustrate processes of manufacturing a solar cell according to another embodiment of the present invention.

FIGS. 7 to 13 sequentially illustrate processes of manufacturing a solar cell according to a second embodiment of the present invention. Referring to FIG. 7, similarly in FIG. 1, an AlN buffer layer 460 is stacked on a silicon substrate 300 that is a sacrificial substrate. A solar cell device layer including an n-GaN layer 430, an intrinsic GaN layer 420, and a p-GaN layer 410, which are sequentially formed is stacked on the buffer layer 460. As described above, the solar cell device layer has various stacked structures.

Figure 8:
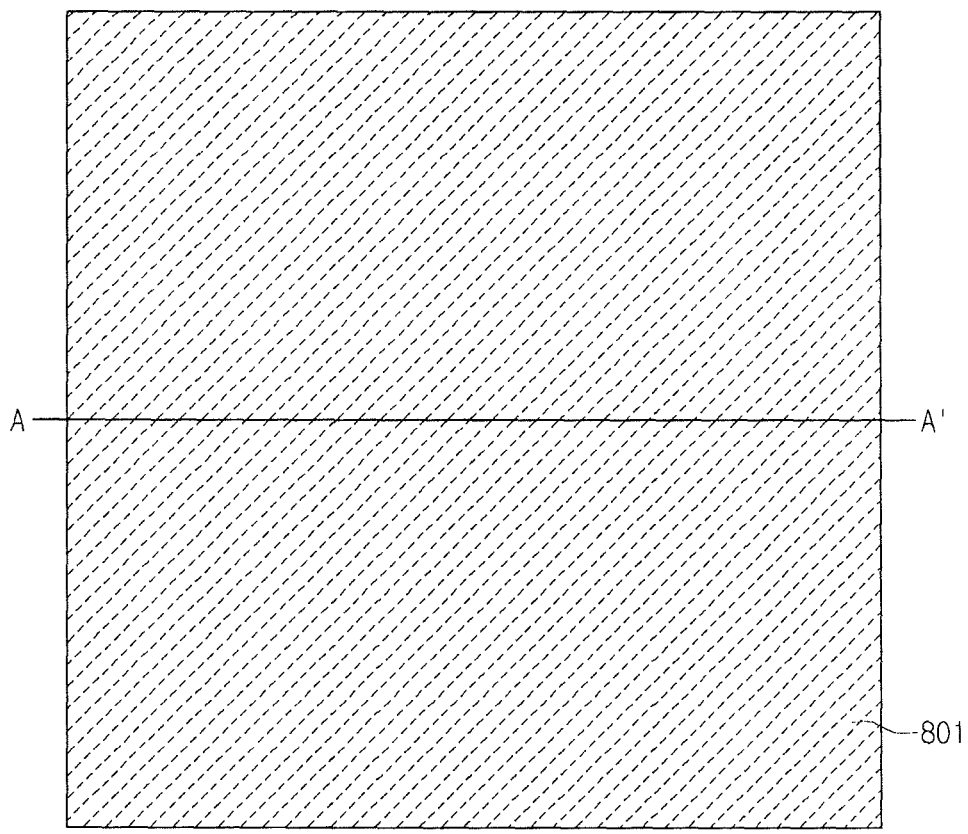
Figure 8:
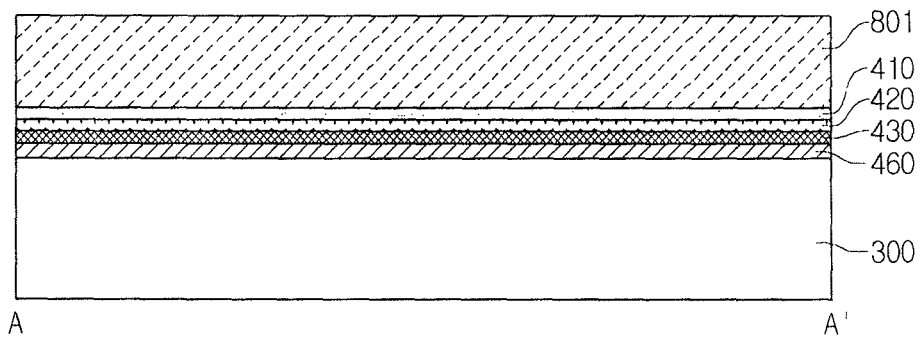

Referring to FIG. 8, a first flexible substrate 801 contacts the solar cell device layer through the same process as that of FIG. 3.

Figure 9:
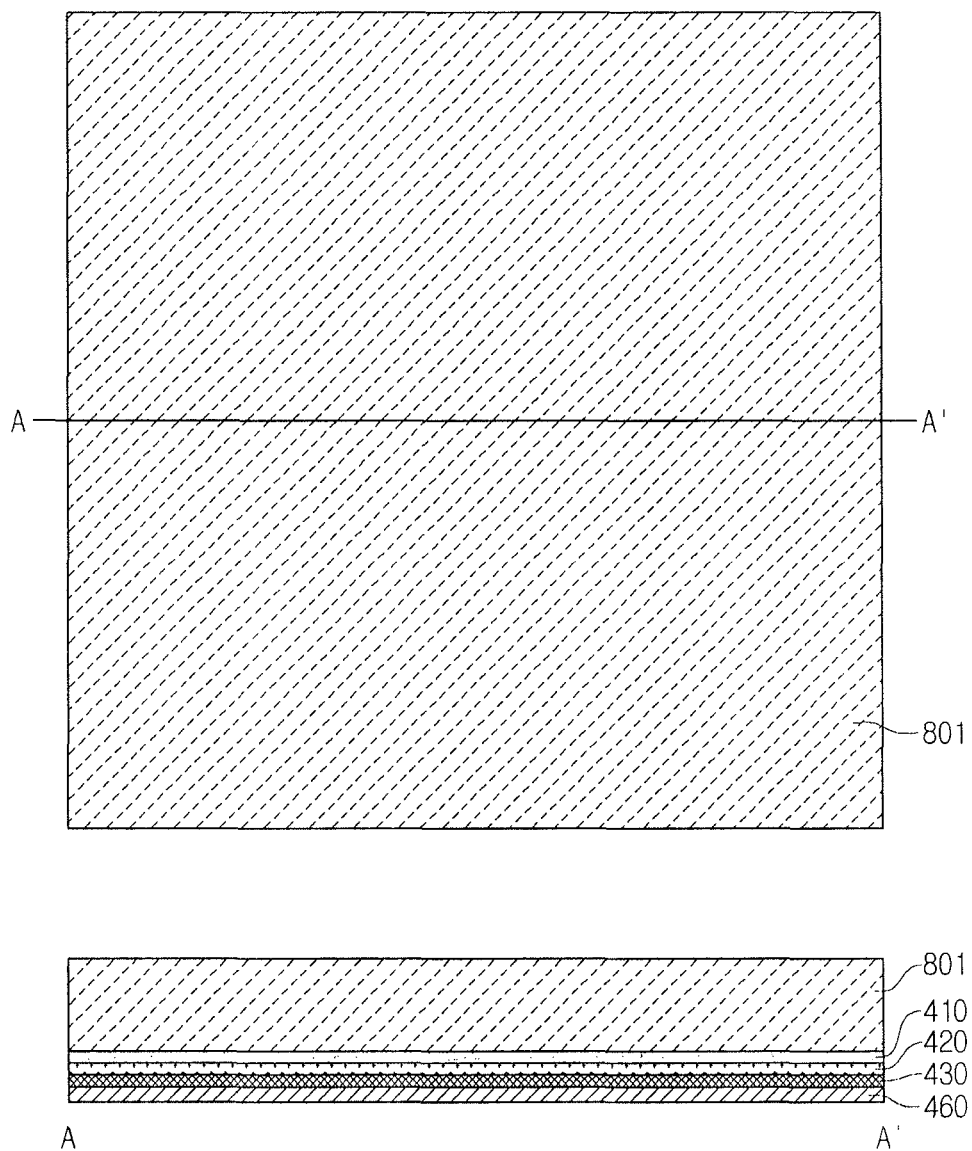

Referring to FIG. 9, a lower silicon substrate 300 is removed. Thus, the solar cell device layer formed on a top surface of the silicon substrate 300 adheres to and is transferred onto the first flexible substrate 801 formed of a material such as polydimethylsiloxane (PDMS). Here, when the flexible substrate is formed of PDMS having adhesion and flexibility in itself, it is not necessary to stack a separate adhesion layer. This is, the device layer directly adheres to the substrate.

The foregoing descriptions are similar to those disclosed in the first embodiment.

Figure 10:
Figure 10:
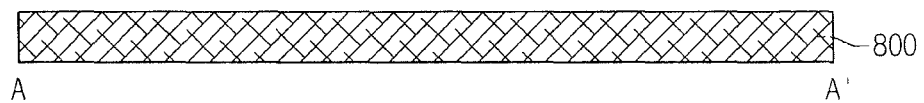
Figure 11:
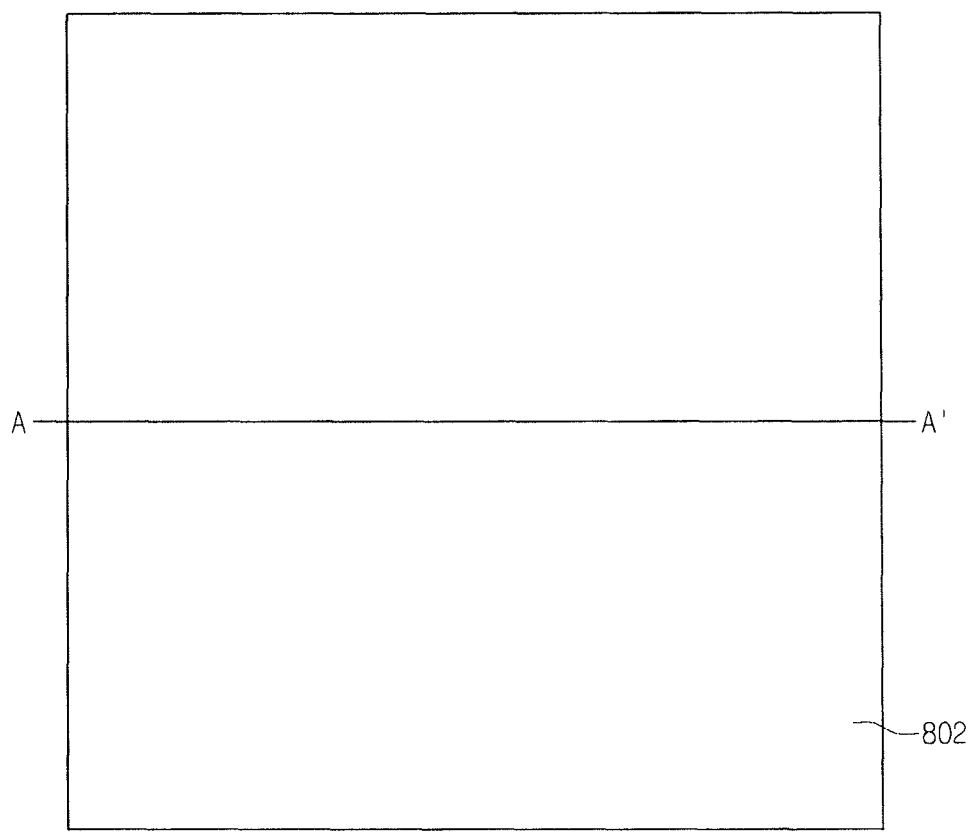
Figure 11:
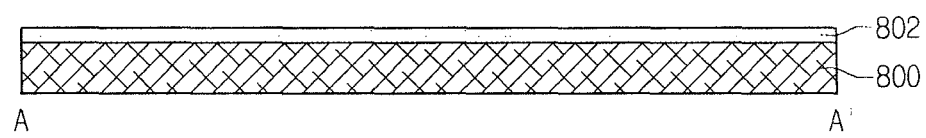
Figure 12:
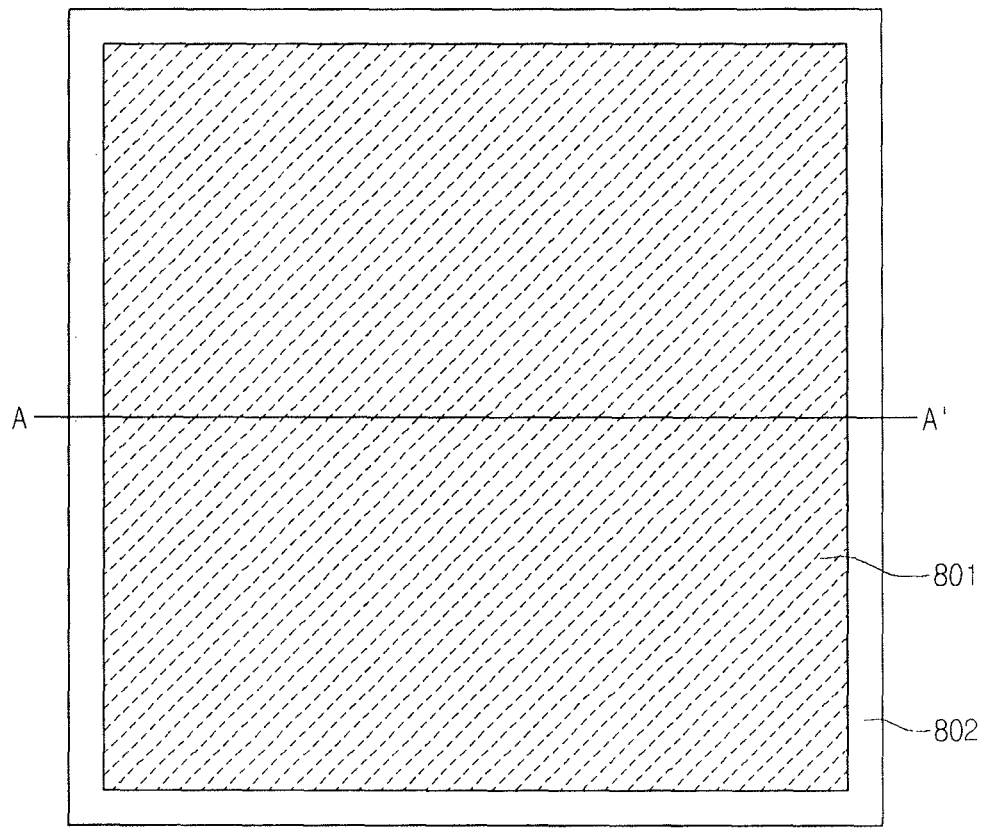
Figure 12:
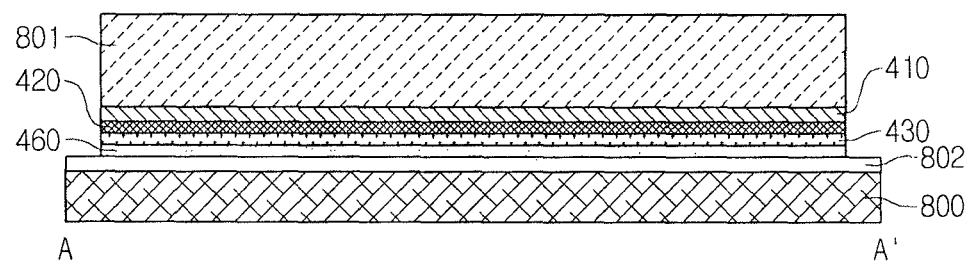

Thereafter, referring to FIG. 10, another flexible substrate (a second flexible substrate) 800 is disclosed. Referring to FIG. 11, a separate adhesion layer 802 is stacked on the second flexible substrate 800. For example, the adhesion layer 802 may be formed of epoxy. Referring to FIG. 12, a solar cell device layer adhering on the first flexible substrate 801 adheres to the second flexible substrate 800. That is, the solar cell device layers 410, 420, and 430 have a shape in which they 410, 420, and 430 are inserted in the two flexible substrates, i.e., a sandwich shape. Specifically, the adhesion layer 802 formed of epoxy has an adhesion force greater than that of the first flexible substrate formed of PDMS having an adhesion force in itself.

Figure 13:
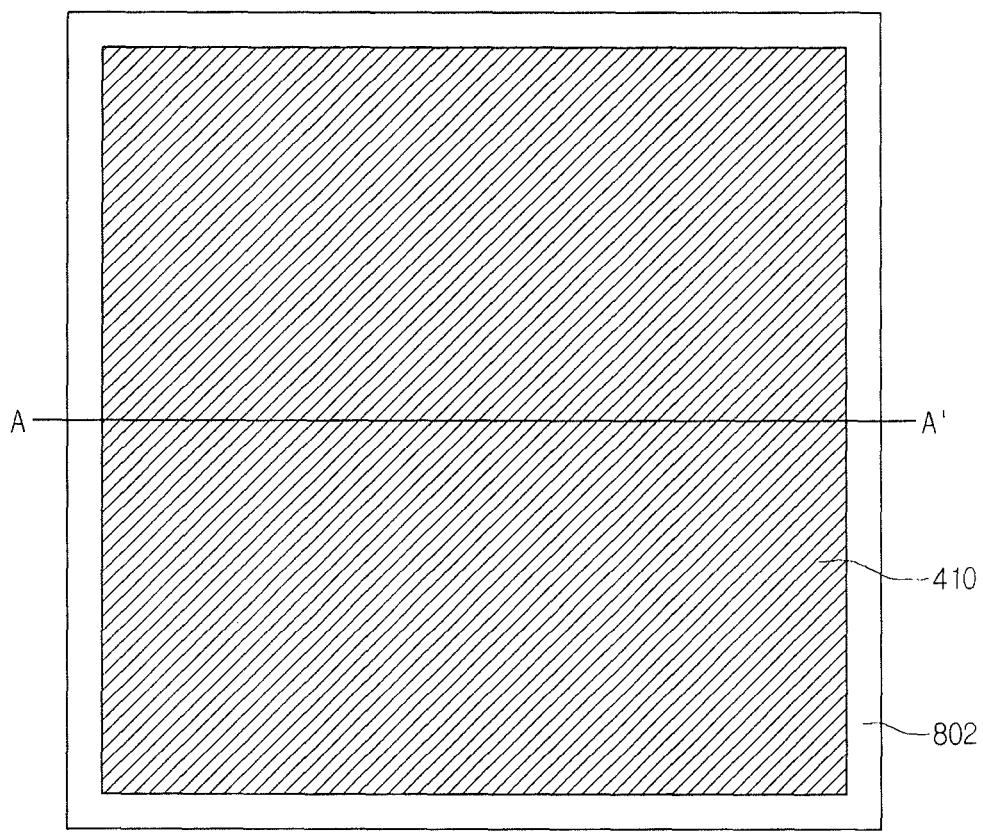
Figure 13:
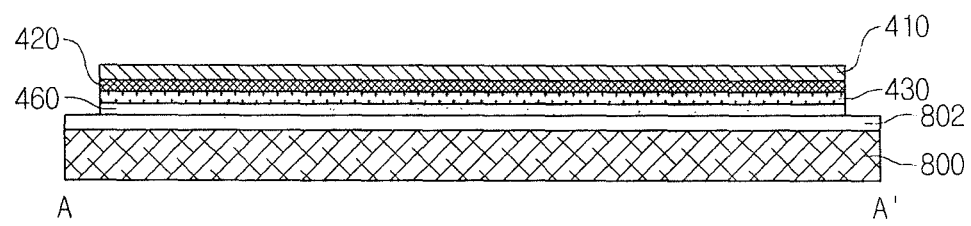

Referring to FIG. 13, the first flexible substrate 801 having a relatively weak adhesion force is separated upward. Here, the adhesion layer 802 having a relatively strong adhesion force and disposed under the solar cell device layer may fixedly maintain the solar cell device layer formed thereon. Thus, the GaN-based solar cell transferred onto the flexible substrate may be manufactured.

Figure 14:
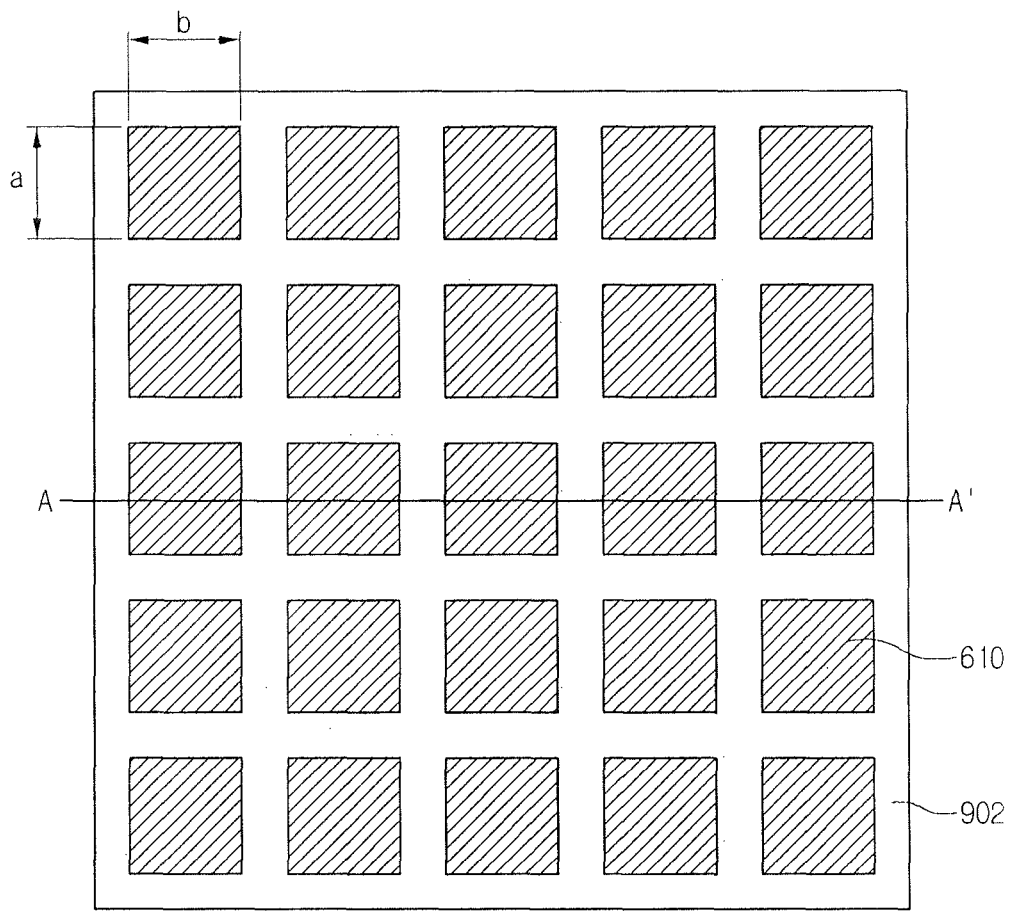
FIG. 14 is plan and sectional view of a light emitting device pixel display manufactured according to an embodiment of the present invention.
Figure 14:
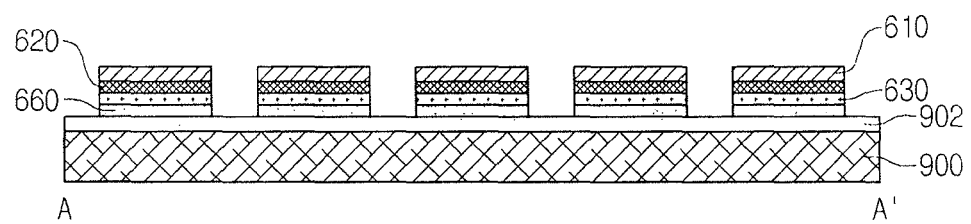

A light emitting device may be manufactured through the same process as that of the foregoing embodiment. FIG. 14 is plan and sectional views of a light emitting device pixel display manufactured according to an embodiment. Referring to FIG. 14, a flexible substrate 900 formed of PET and an adhesion layer 902 stacked on the flexible substrate 900 are provided. A device layer of a light emitting device including an AlN buffer layer 660, an n-GaN layer 630, an intrinsic GaN layer 620, and a p-GaN layer 610, which are sequentially formed is stacked on the adhesion layer 902. That is, after the device layer of the flexible light emitting device is manufactured on a separate silicon substrate that is a sacrificial substrate, the silicon substrate is removed to separate the device layer of the flexible light emitting device from the sacrificial substrate. Before the device layer of the flexible light emitting device is separated from the sacrificial substrate, a separate flexible substrate having an adhesion force contacts the device layer.

Thus, the deformation of the device thin film may be prevented when the device layer of the flexible light emitting device is separated from the sacrificial substrate. Specifically, since the light emitting device has a separate pixel structure in which pixels are spaced and separated from each other, the GaN device layer is selectively etched and patterned on the silicon substrate.

As described above, regardless of a size of the substrate, the patterned device layer of the light emitting device having a large area may be manufactured and transferred. Thus, a related-art limitation in which the etching process is performed downward from an upper side to transfer the device layer, i.e., a limitation in which it is difficult to perform the etching process in a region having an area of greater than about 100 um may be overcame. Therefore, the light emitting device having a pixel size, which cannot be realized in the related art, may be manufactured.

According to the above-described, the high-temperature semiconductor process may be performed on the sacrificial substrate such as the silicon substrate to adhere to the flexible substrate. Thus, the flexible substrate may be transferred to manufacture the flexible device. Also, since the lower silicon substrate is not anisotropically etched, the large area device may be transferred onto the flexible substrate with the superior alignment to realize and manufacture the flexible device. In addition, since mass production is possible, the economic feasibility may be superior. Also, when the large area solar cell having a thin thickness is manufactured, since the limitation such as the twisting of the thin film of the solar cell may be effectively solved, the economic feasibility and stability may be superior.

Although the flexible device is disclosed as the solar cell and the light emitting device and also the method of manufacturing the flexible device in each of the above-described embodiments, the present disclosure are not limited thereto. For example, it may be obvious that various flexible devices except the above-described flexible devices can be manufactured through the various methods disclosed in the foregoing embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a light emitting device pixel display, the method comprising:
   forming a light emitting device layer on an upper surface of a silicon substrate, wherein the device layer includes:
   an AlN buffer layer directly contacting the upper surface of the silicon substrate,
   an n-GaN layer stacked on the AlN buffer layer,
   an InGaN layer stacked on the n-GaN layer, and
   a p-GaN layer stacked on the InGaN layer;
   patterning the p-GaN layer, the InGaN layer, the n-GaN layer, and the AlN buffer layer to form a plurality of pixels separated from each other and to expose a portion of the upper surface of the silicon substrate between the plurality of pixels, each pixel including the AlN buffer layer, the n-GaN layer, the InGaN layer, and the p-GaN layer;
   adhering the p-GaN layer of each pixel to a first flexible substrate without a separate adhesion layer, the first flexible substrate including polydimethylsiloxane (PDMS) having adhesion and flexibility in itself;
   wet-etching the exposed portion of the upper surface of the silicon substrate and a lower surface of the silicon substrate to remove the silicon substrate from the AlN buffer layer of each pixel, each pixel being sustained on the first flexible substrate during removal of the silicon substrate, wherein the silicon substrate is removed through immersion into an etchant, the etchant being a mixture comprising a first component comprising ammonium hydrogen fluoride and ammonium nitrate and a second component comprising dilute sulfuric acid, the first and second components mixed at a ratio of about 1:1 to about 1:2;
   forming an adhesion layer on a second flexible substrate, the adhesion layer including epoxy and the second flexible substrate including polyethylene terephthalate (PET);
   adhering the AlN buffer layer of each pixel to the adhesion layer on the second flexible substrate, an adhesion force between the epoxy of the adhesion layer and the AlN buffer layer of each pixel is greater than an adhesion force between the PDMS of the first flexible substrate and the p-GaN layer of each pixel; and
   upwardly separating the first flexible substrate from the p-GaN layer of each pixel to transfer the plurality of pixels to the second flexible substrate.

2. The method of claim 1, wherein the silicon substrate is removed in a manner such that all of the silicon substrate contacting the plurality of pixels is removed by the etchant.

* * * * *